(12) United States Patent
Nakayama (10) Patent No.: US 7,472,327 B2
(45) Date of Patent: Dec. 30, 2008

(54) PATTERN GENERATOR AND TEST APPARATUS

(75) Inventor: Hiroyasu Nakayama, Tokyo (JP)

(73) Assignee: Advantest Corporation, Tokyo (JP)

( * ) Notice: Subject to any disclaimer, the term of this patent is extended or adjusted under 35 U.S.C. 154(b) by 411 days.

(21) Appl. No.: 11/295,782

(22) Filed: Dec. 7, 2005

(65) Prior Publication Data
US 2006/0161372 A1 Jul. 20, 2006

Related U.S. Application Data

(63) Continuation of application No. PCT/JP2004/006933, filed on May 21, 2004.

(30) Foreign Application Priority Data

Jun. 9, 2003 (JP) .............................. 2003-163461

(51) Int. Cl.
G01R 31/28 (2006.01)
(52) U.S. Cl. ..................................... 714/738
(58) Field of Classification Search ................. 714/738
See application file for complete search history.

(56) References Cited

U.S. PATENT DOCUMENTS

| 5,925,145 | A | 7/1999 | Illes et al. | |
|---|---|---|---|---|
| 6,092,225 | A * | 7/2000 | Gruodis et al. | 714/724 |
| 6,505,137 | B1 * | 1/2003 | Evans et al. | 702/119 |
| 6,567,941 | B1 * | 5/2003 | Turnquist et al. | 714/724 |
| 6,769,083 | B1 * | 7/2004 | Tsuto et al. | 714/738 |
| 6,834,361 | B2 * | 12/2004 | Abbott | 714/42 |

FOREIGN PATENT DOCUMENTS

| DE | 199 55 380 | 5/2000 |
|---|---|---|
| JP | 2-284077 | 11/1990 |
| JP | 4-38482 | 2/1992 |
| JP | 11-237451 | 8/1999 |
| JP | 2000-65904 | 3/2000 |
| WO | WO-00/45187 | 8/2000 |

OTHER PUBLICATIONS

Zarrineh et al., "A New Framework for Automatic Generation, Insertion and Verification of Memory Built-In Self Test Units", Nov. 5, 1998, p. 1-25 IBM.*
NN8901430 19890101 Diagnosis of Array Failures in a Self-Test Environment IBM TDB.*
International Search Report issued for PCT application No. PCT/2004/006933 mailed on Sep. 7, 2004, 2 pages.
Supplementary European Search Report issued for PCT Application No. PCT/2004/006933 mailed on May 29, 2006, 3 pages.

* cited by examiner

*Primary Examiner*—Cynthia Britt
(74) *Attorney, Agent, or Firm*—Osha • Liang LLP (57) ABSTRACT

A pattern generator includes a main memory for storing a plurality of sequence data blocks for generating a test pattern, a first sequence cache memory for sequentially storing the sequence data blocks, a second sequence cache memory, a data development section for sequentially executing the sequence data blocks stored in the first cache memory and generating a test pattern and a read-ahead means, when the data development section detects a read-ahead instruction on reading ahead the other sequence blocks during executing one sequence data block, for reading the other sequence blocks from the main memory and storing the same in the second sequence cache memory.

10 Claims, 9 Drawing Sheets

MAIN MEMORY60

| ADDRESS | DATA AREA |
|---|---|
| FFFF ⌇ | SEQUENCE DATA BLOCK1 |
| | SEQUENCE DATA BLOCK2 |
| ⋮ | ⋮ |
| | SCAN SEQUENCE DATA BLOCK1 |
| | SCAN SEQUENCE DATA BLOCK2 |
| ⋮ | ⋮ |
| | PATTERN DATA BLOCK1 |
| | PATTERN DATA BLOCK2 |
| ⋮ | ⋮ |
| | SCAN PATTERN DATA BLOCK1 |
| ⌇ XXXX | SCAN PATTERN DATA BLOCK2 |
| ⋮ | ⋮ |

- SEQUENCE DATA BLOCK1, BLOCK2, ... → SEQUENCE DATA
- SCAN SEQUENCE DATA BLOCK1, BLOCK2, ... → SCAN SEQUENCE DATA
- PATTERN DATA BLOCK1, BLOCK2, ... → PATTERN DATA
- SCAN PATTERN DATA BLOCK1, BLOCK2, ... → SCAN PATTERN DATA

MAIN MEMORY60

| ADDRESS | DATA AREA | | | | |
|---|---|---|---|---|---|
| | PIN1 | PIN2 | PIN3 | PIN4 | ... |
| FFFF ⁠ ⁠ | SQ1-1 | SQ2-1 | SQ3-1 | SQ4-1 | |
| | SQ1-2 | SQ2-2 | SQ3-2 | SQ4-2 | |
| ⋮ | ⋮ | ⋮ | ⋮ | ⋮ | |
| | SC1-1 | | | | ~210 |
| | SC1-2 | | | | |
| ⋮ | | | | | |
| | PD1-1 | PD2-1 | PD3-1 | PD4-1 | |
| | PD1-2 | PD2-2 | PD3-2 | PD4-2 | |
| ⋮ | | | | | |
| | SP1-1 | | | | ~220 |
| | SP1-2 | | | | |

FIG. 8

MAIN MEMORY60

| ADDRESS | DATA AREA | | | | |
|---|---|---|---|---|---|
| | PIN1 | PIN2 | PIN3 | PIN4 | ... |
| FFFF ⟨ | SQ1-1 | SQ2-1 | SQ3-1 | SQ4-1 | |
| | SQ1-2 | SQ2-2 | SQ3-2 | SQ4-2 | |
| ⋮ | ⋮ | ⋮ | ⋮ | ⋮ | |
| | SC1-1 | SC1-3 | SC1-5 | SC1-7 | |
| | SC1-2 | SC1-4 | SC1-6 | SC1-8 | |
| ⋮ | | | | | |
| | PD1-1 | PD2-1 | PD3-1 | PD4-1 | |
| | PD1-2 | PD2-2 | PD3-2 | PD4-2 | |
| ⋮ | | | | | |
| | SP1-1 | SP1-3 | SP1-5 | SP1-7 | |
| | SP1-2 | SP1-4 | SP1-6 | SP1-8 | |

*FIG. 9*

PATTERN GENERATOR AND TEST APPARATUS

BACKGROUND OF THE INVENTION

The present application is a continuation application of PCT/JP2004/006933 filed on Nov. 26, 2004 which claims priority from a Japanese Patent Application No. 2003-163461 filed on Jul. 9, 2003, the contents of which are incorporated herein by reference.

BACKGROUND OF THE INVENTION

1. Field of the Invention

The present invention relates to a pattern generator and a test apparatus, particularly relates to a pattern generator and a test apparatus for testing an electronic device.

2. Related Art

Generally, a pattern generator is used for a test apparatus for testing an electronic device. The pattern generator generates test patterns being input signals for testing electronic devices, which are inputted into an electronic device. The pattern generator generates a test pattern from pattern data and sequence data.

The pattern generator includes a memory for storing a group of pattern data and a group of sequence data in the execution order and a cache memory for sequentially reading the pattern data and the sequence data from the memory and storing the same. The sequence data is a group of instructions on indicating the order of outputting the pattern data to generate a test pattern, which is composed of a jump instruction and a loop instruction and so on.

The pattern generator sequentially reads the pattern data and the sequence data from the memory and stores the same in the cache memory. The pattern generator also generates a test pattern from the pattern data stored in the cache memory based on the group of instructions of the sequence data stored in the cache memory.

When an instruction to be jumped to the addresses of the sequence data and the pattern data which are not stored in the cache memory is detected in the group of the instructions of the sequence data, the pattern generator reads from the sequence data and the pattern data corresponding to the addresses and stores the same in the cache memory.

Therefore, when the sequence data and the pattern data are read from the memory, a reading time occurs so that a latency time occurs in generating of a pattern. Additionally, when a function test and a scan test of an electronic device is executed, it has been necessary to store the data for the function test and the data for the scan test in contiguous address spaces on the memory in the execution order. Therefore, when the data for the scan test will be used multiple times, a plurality of same data should be stored in the memory, so that a mass memory is required.

SUMMARY OF THE INVENTION

Thus, the object of the present invention is to provide a pattern generator and a test apparatus to solve the above-described problems. This object is achieved by combining the features recited in independent claims. Then, dependent claims define further effective specific example of the present invention.

To solve the above-described problem, a pattern generator for generating a test pattern for testing an electronic device from a predetermined test data is provided in a first embodiment of the present invention. The pattern generator includes a main memory for storing a plurality of sequence data blocks for generating a test pattern; a first sequence cache memory for sequentially storing the sequence data blocks; a second sequence cache memory; a data development section for sequentially executing the sequence data blocks stored in the first cache memory and generating a test pattern; and a read-ahead means, when the data development section detects a read-ahead instruction on reading ahead the other sequence blocks during executing one sequence data block, for reading the other sequence data blocks from the main memory and storing the same in the second sequence cache memory.

The data development section may read the other sequence data blocks from the second sequence cache memory and execute the same when the data development section detects the jump instruction on executing the other sequence data block after detecting the read-ahead instruction. Alternatively, the data development section may read the subsequent sequence data block from the first sequence cache memory when the data development section does not detect any jump instruction in one sequence data block after detecting the read-ahead instruction.

The main memory may further store a plurality of pattern data blocks indicative of signals to be provided to the electric device corresponding to the sequence data blocks. The pattern generator may further include a first pattern cache memory for storing pattern data blocks corresponding to the sequence data blocks stored in the first sequence cache memory and a second pattern cache memory. The read-ahead means may read the pattern data blocks corresponding to the other sequence data blocks from the main memory and stores the same in the second pattern cache memory when the data development section detects a read-ahead instruction on reading ahead the other sequence data blocks during executing one sequence data block. The data development section may develop the pattern data blocks corresponding to the other sequence data blocks by executing the sequence data blocks to generate a test pattern.

The read-ahead instruction designates the first addresses of the sequence data block and the corresponding pattern data block to be read ahead in the main memory. The read-ahead means may read ahead the sequence data block and the pattern data block from the main memory using the designated first addresses.

The read-ahead instruction also designates the labels of the sequence data block and the pattern data block to be read ahead. The pattern generator may further include a reference memory for associating the labels with each address designated by the labels of the sequence data block and the pattern data block in the main memory and storing the same. The read-ahead means may obtain the addresses of the main memory from the reference memory based on the labels and read ahead the sequence data block and the pattern data block from the main memory based on the obtained addresses.

The sequence data blocks may include scan sequence data blocks for executing a scan test for an electronic device. The pattern data blocks may include scan pattern data blocks for executing a scan test for an electronic device. The read-ahead means may read ahead the scan sequence data blocks and the scan pattern data blocks.

The data development section may execute one scan sequence block multiple times in generating one test pattern. The main memory may store a plurality of scan sequence data blocks in contiguous areas. The main memory may a plurality of scan pattern data blocks in contiguous areas.

When the data development section detects a return instruction on returning to the instruction following the jump instruction in one sequence data block during executing the other sequence data block, the data development section may read the instruction following the return instruction in one sequence data block from the first sequence cache memory and execute the same.

In a second embodiment of the present invention, a test apparatus for testing an electronic device is provided. The test apparatus includes a pattern generator for generating a test pattern for testing an electronic device, a waveform shaper for shaping the test pattern and a determination section for determining whether is good or bad of the electronic device based on the output signal outputted from the electronic device according to the test pattern. The pattern generator includes a main memory for storing a plurality of sequence data blocks used for generating a test pattern; a first sequence cache memory for sequentially storing the sequence data blocks; a second sequence cache memory; a data development section for sequentially executing the sequence data blocks stored in the first cache memory and generating a test pattern; and a read-ahead means, when the data developing means detects a read-ahead instruction on reading ahead the other sequence data blocks during executing one sequence data block, for reading the other sequence data blocks from the main memory and storing the same in the second sequence cache memory. The data development section reads the other sequence data blocks from the second sequence cache memory and executes the same when the data developing section detects a jump instruction on executing the other sequence data blocks after detecting the read-ahead instruction. Alternatively, the data development section reads the subsequent sequence data block from the first sequence cache memory and executes the same when the data development section does not detect any jump instruction on executing the other sequence data blocks in one sequence data block after detecting the read-ahead instruction.

Here, all necessary features of the present invention are not listed in the summary of the invention. The sub-combinations of the features may become the invention.

According to the present invention, test patterns can be efficiently generated. Additionally, an electronic device can be efficiently tested. Further, the memory capacity used can be reduced.

DETAILED DESCRIPTION OF THE INVENTION

Hereinafter, the present invention will now be described through preferred embodiments. The embodiments do not limit the invention according to claims and all combinations of the features described in the embodiments are not necessarily essential to means for solving the problems of the invention.

Figure 1:
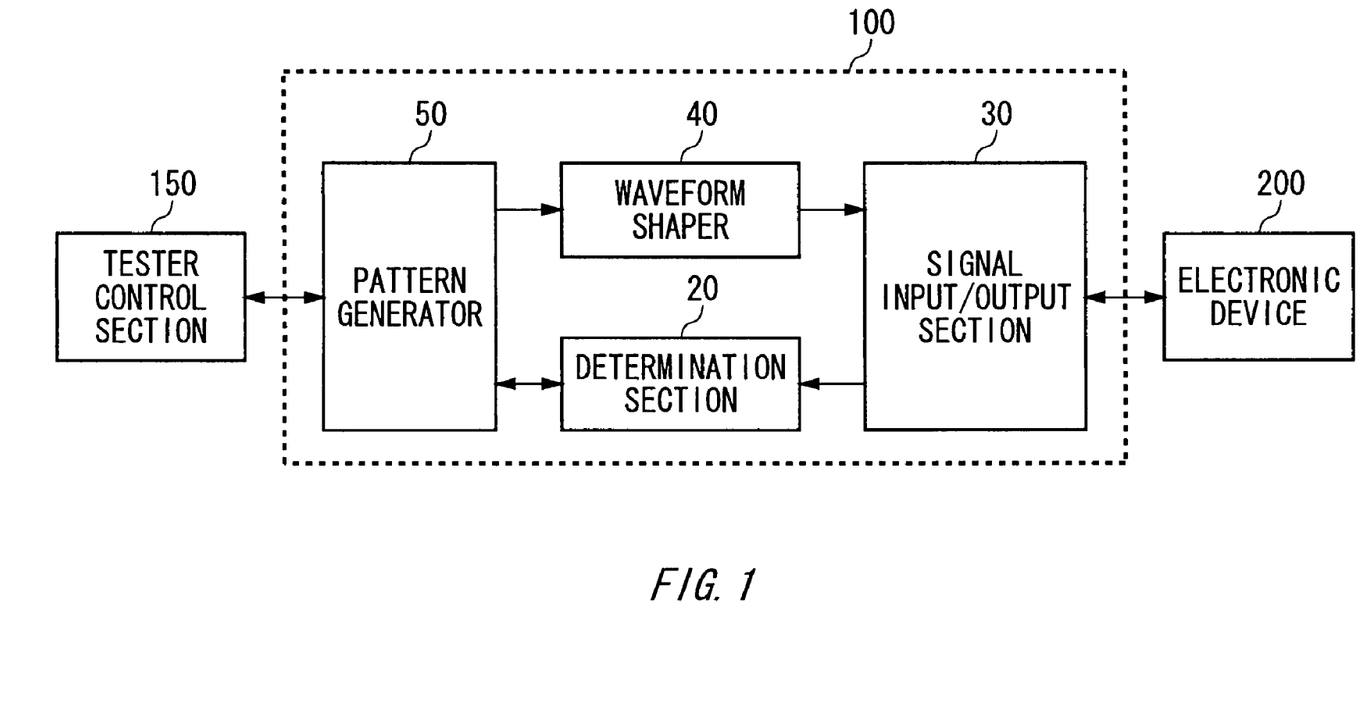
FIG. 1 shows an example of the configuration of a test apparatus 100 according to an embodiment of the present invention.

FIG. 1 shows an example of the configuration of a test apparatus 100 according to an embodiment of the present invention. The test apparatus 100 tests an electronic device 200. The test apparatus 100 includes a pattern generator 50, an waveform shaper 40, a signal input/output section 30 and a determination section 20. Here, the electronic device 200 is a device for operating responsive to the received electrical signals. The electronic device 200 includes a semiconductor circuit such as an IC chip and a LSI having semiconductor elements.

The pattern generator 50 receives test dada used for testing the electronic device 200 from a tester control section 150 externally provided and generates a test pattern for testing the electronic device 200 based on the test data. The tester control section 150 is a computer such as a work station. The pattern generator 50 may generate an expected value signal indicative of an expected value to be outputted by the electronic device 200 based on the inputted test pattern.

The waveform shaper 40 receives and shapes a test pattern, and provides the same to the signal input/output section 30 at the desired timing. The signal input/output section 30 provides the received test pattern to the electronic device 200 and receives the output signal outputted by the electronic device 200 based on the test pattern. The signal input/output section 30 provides the received output signal to the determination section 20.

The determination section 20 determines whether is good or bad of the electronic device 200 based on the received output signal. For example, the determination section 20 receives an expected value signal from the pattern generator 50 and compares the expected value signal with the output signal from the electronic device 200 to determine whether is good or bad of the electronic device 200.

Figure 2:
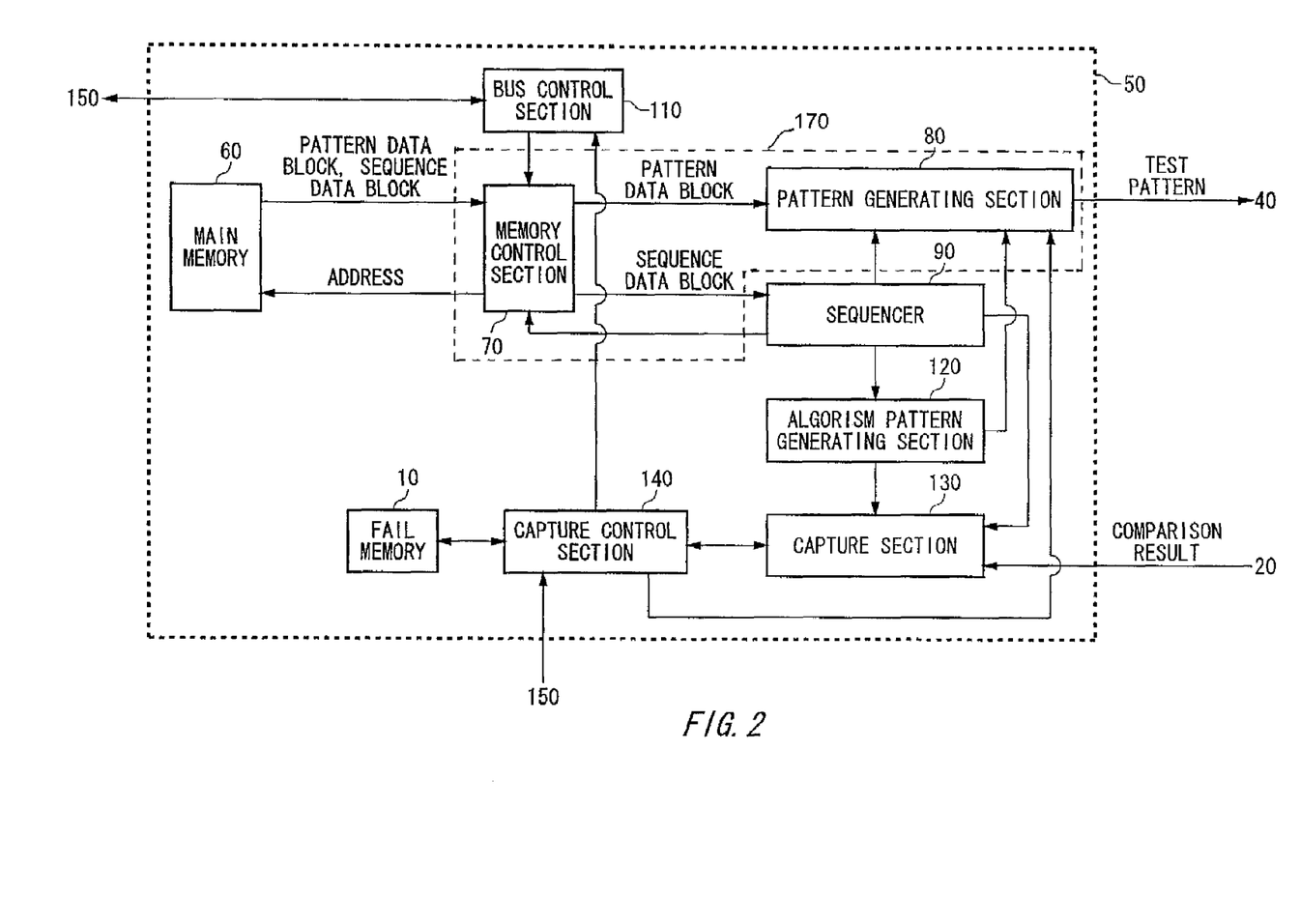
FIG. 2 shows an example of the configuration of a pattern generator 50.

FIG. 2 shows an example of the configuration of the pattern generator 50. The pattern generator 50 includes a main memory 60, a data development section 170, a sequencer 90, a bus control section 110, an algorism pattern generating section 120, a capture section 130, a capture control section 140 and a fail memory 10. The data development section 170 includes a memory control section 70 and a pattern generating section 80.

The main memory 60 stores test data for generating test patterns. The test data is divided into a plurality of test data blocks and stored. For example, the main memory 60 stores a plurality of pattern data blocks into which the pattern data indicative of the signals to be provided to the electronic device 200 is divided and a plurality of sequence data blocks into which the sequence data indicative of the order of the pattern data to be provided to the electronic device 200 is divided as the test data blocks. The main memory 60 associates the pattern data blocks with the sequence data blocks and stores the same.

The bus control section 110 receives indication information indicating the order of providing the test data blocks to the pattern generating section 80 and/or the sequencer 90 and sequentially indicates to the memory control section 70 which of the pattern blocks and/or the sequence data blocks should be read from the main memory 60 based on the indication information. The memory control section 70 sequentially reads the pattern data blocks and the sequence data blocks from the main memory 60, sequentially provides the read pattern data blocks to the pattern generating section 80 and also sequentially provides the read sequence data blocks to the sequencer 90.

The pattern generating section 80 sequentially receives the pattern data blocks and generates a test pattern based on the pattern data blocks. The sequencer 90 sequentially stores the received sequence data blocks and controls the pattern generating section 80 based on the stored sequence data blocks. For example, the sequence data blocks are a program for indicating the order of outputting data in the pattern data blocks to generate a test pattern, which causes the test pattern generating section 80 to generate the test pattern according to the program. The sequencer 90 may sequentially indicate to the pattern generating section 80 the address of the pattern data block to be outputted by the pattern generating section 80 based on the sequence data blocks.

If the electronic device 200 to be tested is a memory, the sequencer 90 may provide an indicating signal to instruct on generating pattern data for a memory test to the algorism pattern generating section 120. Receiving the indicating signal, the algorism pattern generating section 120 generates pattern data for the memory test based on a preset algorism. In this case, the pattern generating section 80 generates a test pattern based on the pattern data for the memory test.

The capture section 130 and the capture control section 140 store the determination result of the determination section 20 in the fail memory 10. The capture section 130 receives either or both of the address of the pattern data block which is indicated to the pattern generating section 80 by the sequencer 90 or the data for the memory test generated by the algorism pattern generating section 120. The capture section 130 adds to the determination result either or both of the corresponding address of the pattern data block or the corresponding data for the memory test. The capture control section 140 receives from the tester control section 150 an indicating signal to indicate whether the determination result should be stored in the fail memory 10 and provides the determination result to the fail memory 10 based on the indicating signal.

Additionally, when the test by one pattern data block is completed, the capture control section 140 may notify the bus control section 110 of the determination result in the pattern data block. In this case, the bus control section 110 notifies the tester control section 150 of the determination result.

Additionally, the fail memory 10 stores the determination result of the determination section 20. The tester control section 150 may read the determination result stored in the fail memory 10 and analyze the test result of the electronic device 200. The tester control section 150 also may analyze the test result based on the determination result for each pattern data block. Further, the pattern generator 50 has the fail memory 10 in the present embodiment. However, the pattern generator 50 does not have the fail memory 10 but the test apparatus 100 may have the fail memory 10 and the tester control section 150 may have the fail memory 10 in another embodiment.

Figure 3:
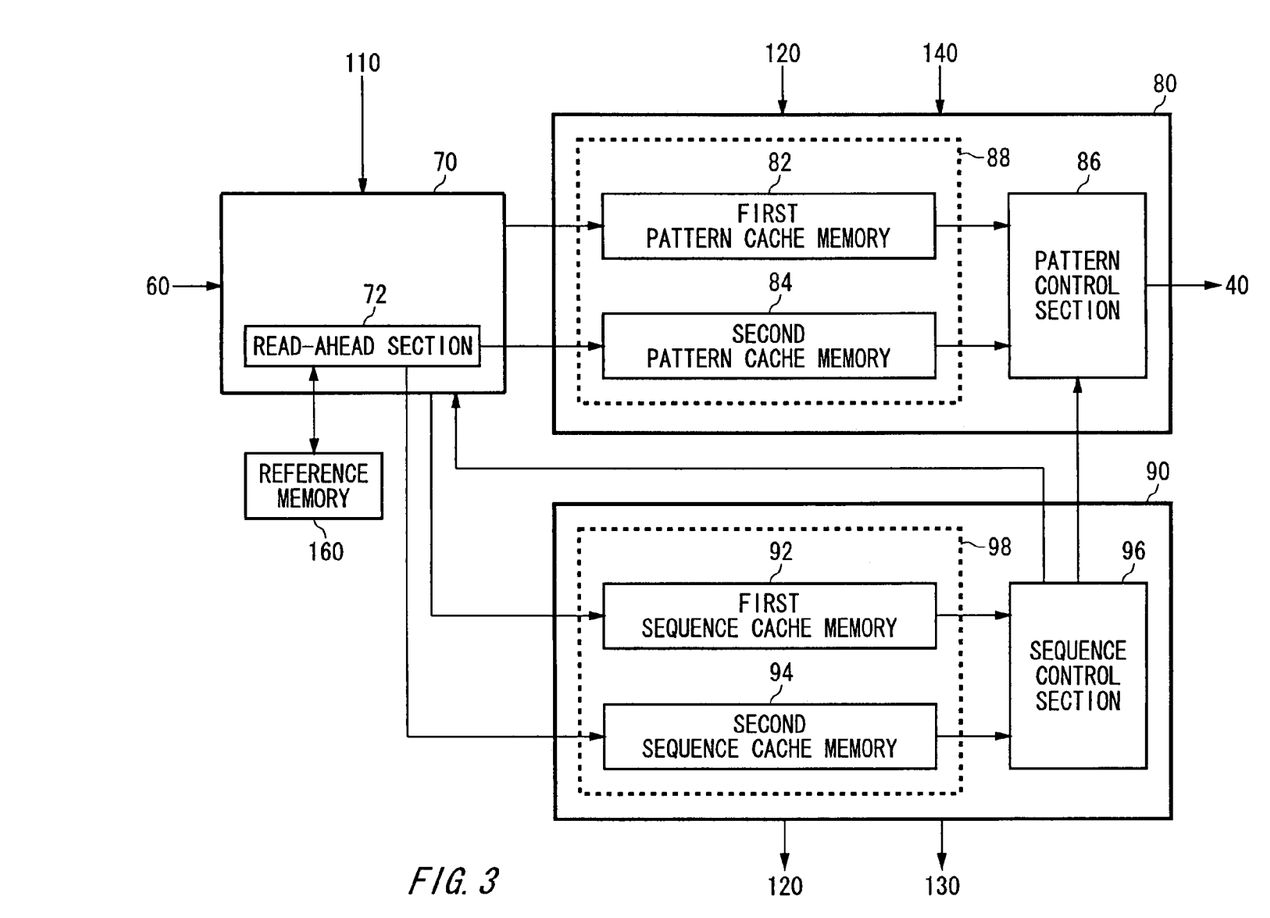
FIG. 3 shows an example of the detailed configuration of a memory control section 70, a pattern generating section 80 and a sequencer 90.

FIG. 3 shows an example of the detailed configuration of the memory control section 70, the pattern generating section 80 and the sequencer 90. The memory control section 70 includes a read-ahead means 72. The pattern control section 80 includes a cache memory 88 and a pattern control section 86. The sequencer 90 includes a cache memory 98 and a sequence control section 96.

The memory control section 70 reads data from the main memory 60 based on indication information received from the bus control section 110 and stores the same in the cache memory 88 and the cache memory 98. The cache memory 88 has a first pattern cache memory 82 and a second pattern cache memory 84. The cache memory 98 has a first sequence cache memory 92 and a second sequence cache memory 94.

The memory control section 70 sequentially stores the pattern data blocks in the first pattern cache memory 82 and also sequentially stores the sequence data blocks in the first sequence cache memory 92 based on indication information received from the bus control section 110.

The pattern control section 86 generates a test pattern based on the pattern data blocks stored in the first pattern cache memory 82. For example, the pattern control section 86 sequentially receives the addresses in the first pattern cache memory 82 from the sequence control section 96 and sequentially outputs the pattern data of the received addresses to generate a test pattern.

The sequence control section 96 sequentially retrieves the sequence data blocks stored in the first sequence cache memory 92 and executes the same. For example, the sequence data blocks are a group of instructions including such as a jump instruction, a loop instruction and a return instruction. The sequence control section 96 sequentially indicates the addresses in the first pattern cache memory 82 to the pattern control section 86 based on the instruction of the sequence data blocks.

When the sequence control section 96 detects a read-ahead instruction on reading ahead the other sequence data block during executing one sequence data block, the sequence control section 96 notifies the read-ahead means 72 in the memory control section 70 of the read-ahead instruction. For example, the sequence control section 96 detects a read-ahead instruction on reading ahead the subroutine of the test pattern during executing the sequence data block indicative of the main routine of the test pattern, the sequence control section 96 notifies the memory control section 70 accordingly.

Receiving the notification of the read-ahead instruction from the sequence control section 96, the read-ahead means 72 reads the sequence data block designated by the read-ahead instruction from the main memory 60 and stores the same in the second sequence cache memory 94. Additionally, the read-ahead means 72 stores the pattern data block corresponding to the sequence data block stored in the second sequence cache memory 94 in the second pattern cache memory 84. The read-ahead means 72 reads ahead data from main memory 60 and stores the same during operating the pattern control section 86.

When the sequence control section 96 detects a jump instruction on executing the sequence data blocks stored in the second sequence cache memory 94 after detecting the read-ahead instruction, the sequence control section 96 reads the sequence data blocks stored in the second sequence cache memory 94 and executes the same. Then, the pattern control section 86 generates a test pattern based on the corresponding pattern data blocks stored in the second pattern cache memory 84. In this case, the sequence control section 96 may designate the address in the second pattern cache memory 84. Additionally, when the first pattern cache memory 82 and the second pattern cache memory 84 are two address spaces in the same cache memory, the sequence control section 96 may use the address of the cache memory.

When the sequence control section 96 does not detect any jump instruction from the sequence data block in execution after detecting the read-ahead instruction, the sequence control section 96 reads the sequence data block to be subsequently executed, which is stored in the first sequence cache memory 92 and executes the same.

Here, the read-ahead instruction may be an instruction to indicate the first address of the sequence data block to be read ahead in the main memory. The read-ahead instruction also may be an instruction to indicate the label of the sequence data block to be read ahead. Here, the label is information to specify each sequence data block. In this case, the pattern generator 50 may further include a reference memory 160 for associating a label with the first address of the corresponding sequence data block in the main memory to store the same. The sequence control section 96 may notify the read-ahead means 72 of the label. Then, the read-ahead means 72 may extract the address in the main memory from the reference memory 160 based on the label and read the sequence data block at the extracted address from the main memory 60.

Additionally, the read-ahead means 72 reads the pattern data block corresponding to the read sequence data block from the main memory 60 and stores the same in the second pattern cache memory 84. The read-ahead means 72 reads ahead the test data from the main memory 60 and stores the same in the second pattern cache memory 84 and the second sequence cache memory 94 during operating the other components of the pattern generator 50. Thereby the pattern generator 50 according to the present embodiment can reduce the latency time for reading data and continuously generate test patterns. The memory control section 70 sequentially stores test data in the first pattern cache memory 82 and the first sequence cache memory 92 based on the indicating information. Since the memory control section 70 also sequentially stores test data during operating the other components of the pattern generator 50, the teat patterns can be continuously generated. As thus described above, the pattern generator 50 according to the present embodiment can efficiently generate test patterns.

The first pattern cache memory 82 and the second pattern cache memory 84 may be two address spaces in the same cache memory, and may be two cache memories. Additionally, the first sequence cache memory 92 and the second sequence cache memory 92 are same as described above.

The test apparatus 100 may execute a scan test for the electronic device. Here, the scan test includes a test of which test specification is determined by IEEE1149.1, which tests the scan path of the electronic device. In this case, the pattern data blocks stored in the main memory 60 include scan pattern data blocks for the scan test. The sequence data blocks stored in the main memory 60 include scan sequence data blocks for the scan test. Additionally, the test apparatus 100 may execute a combination of the scan test and the other test. For example, the test apparatus 100 may execute a combination of the scan test and a function test for testing the logical section of the electrical device.

Figure 4:
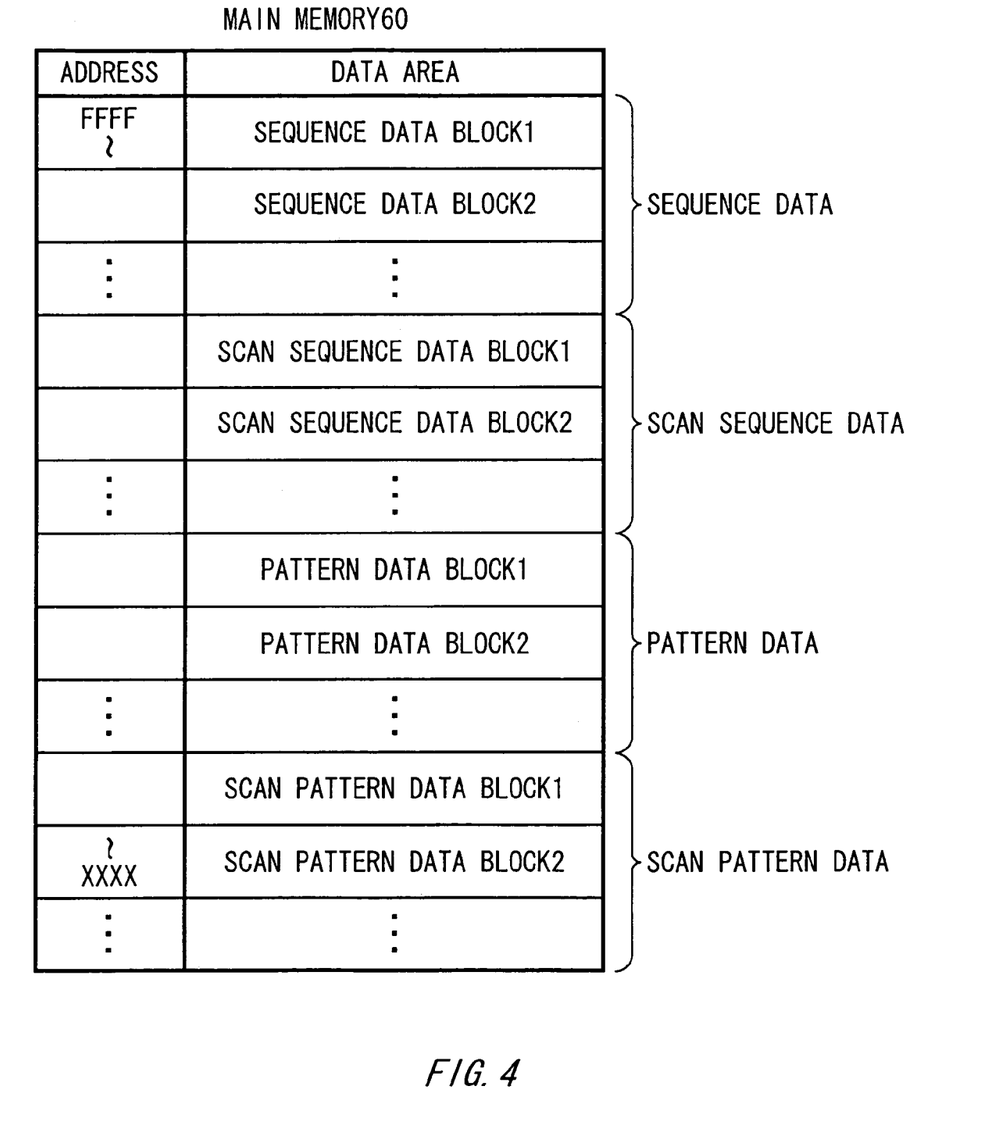
FIG. 4 shows an example of the data configuration of a main memory 60.

FIG. 4 shows an example of the data configuration of a main memory 60. The test apparatus 100 executes a function test and a scan test in the present embodiment. The main memory 60 stores a plurality of sequence data blocks, a plurality of scan sequence data blocks, a plurality of pattern data blocks and a plurality of scan pattern data blocks in the continuous areas, respectively. The pattern generator 50 according to the present embodiment reads data blocks based on the first address of the data blocks for the scan test, which is designated by the read-ahead instruction, so that data blocks can be continuously stored for each data block type in the main memory.

Additionally, the pattern generator according to the present embodiment can continuously generate test patterns without storing each data block in the main memory in the execution order. Therefore, data are easily added, deleted and replaced in units of data block.

Figure 5:
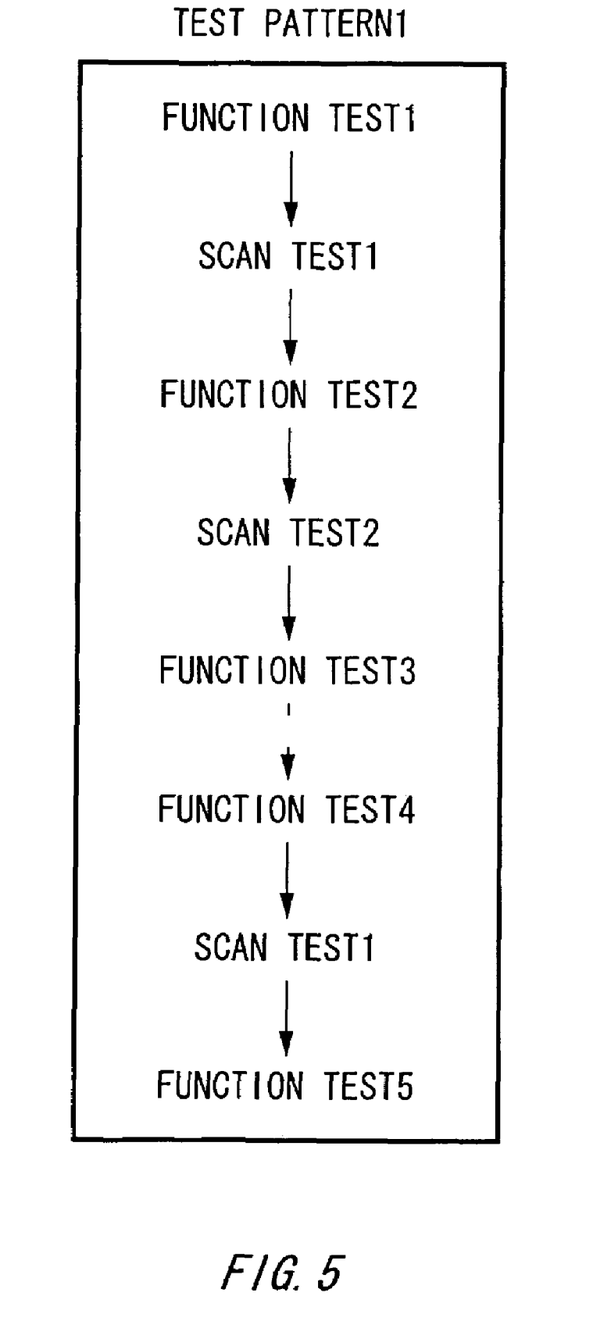
FIG. 5 shows an example of the test pattern generated by the pattern generator 50.

FIG. 5 shows an example of the test pattern generated by the pattern generator 50. The pattern generator 50 generates a test pattern for the test by combining the function test and the scan test in the present embodiment.

Figure 6:
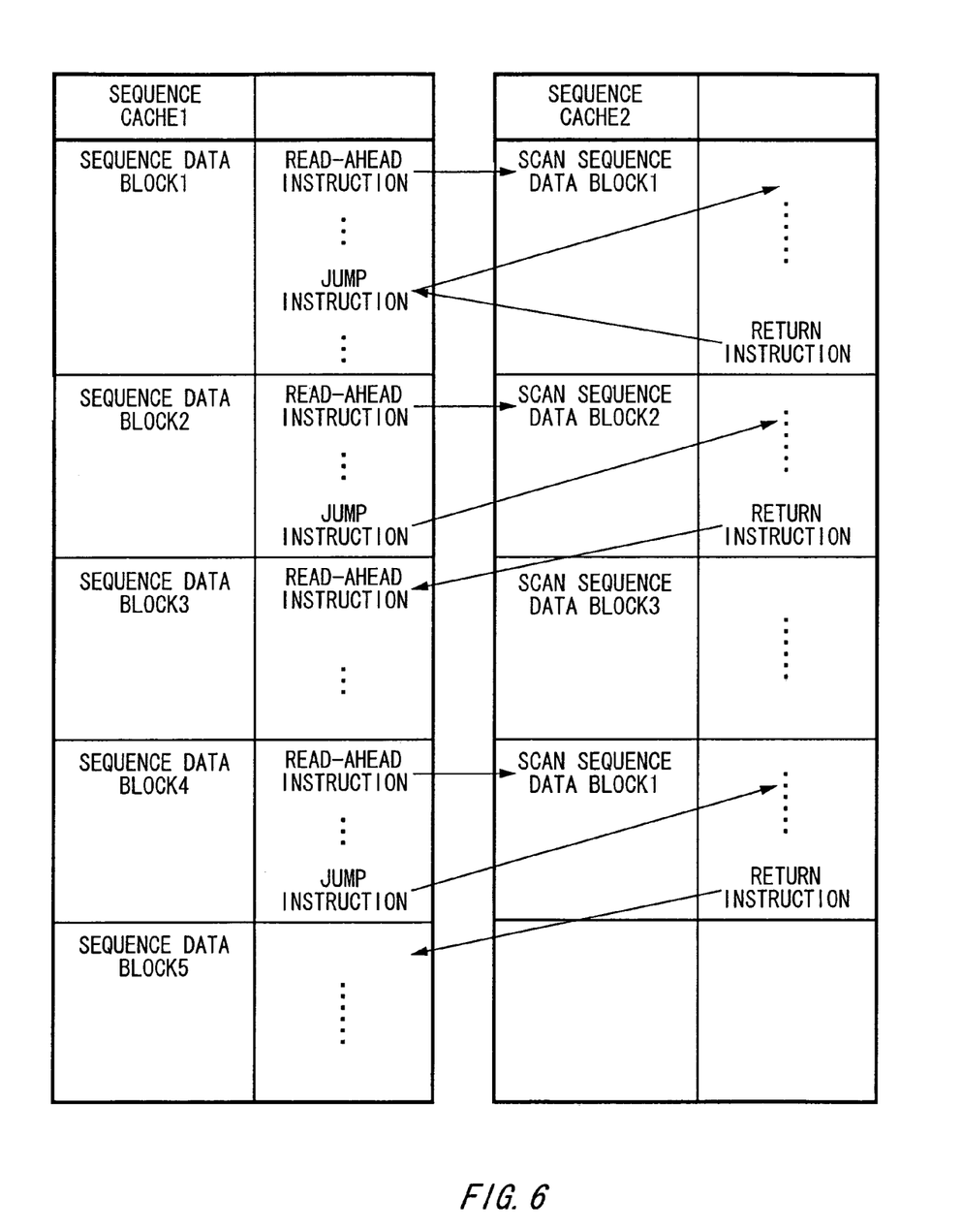
FIG. 6 shows an example of the operation of the pattern generator 50.

FIG. 6 shows an example of the operation of the pattern generator 50. The pattern generator 50 generates the test pattern as shown in FIG. 5 in the present embodiment. The pattern generator 50 mainly executes function tests based on the sequence data blocks stored in the first sequence cache memory 92, and executes scan tests based on the sequence data blocks stored in the second sequence cache memory 94 in the present embodiment.

Firstly, the memory control section 70 sequentially stores the pattern data blocks and the sequence data blocks used for generating the test pattern based on the indicating information in the first pattern cache memory 82 and the first sequence cache memory 92. Here, the memory control section 70 may delete the data blocks which have been already executed and sequentially stores data blocks in the free spaces generated by deleting the data blocks. Additionally, the memory control section 70 may overwrite the data block to be subsequently stored on the data block which has been already executed. Preferably, the cache memory has a plurality areas which can store a plurality of data blocks.

The sequencer 90 sequentially executes sequence data blocks stored in the first sequence cache memory 92. Detecting a read-ahead instruction in the sequence data block 1 in execution, the read-ahead means 72 stores the scan sequence data block 1 designated by the read-ahead instruction in the second sequence cache memory 94.

Detecting a jump instruction in the sequence data block 1, the sequencer 90 executes the scan sequence data block 1 stored in the second sequence cache memory 94. When the sequencer 90 detects a return instruction on returning the instruction following the jump instruction in the sequence data block 1, the sequencer 90 reads the instruction following the jump instruction and executes the same. When the jump instruction is the last instruction in the sequence data block 1, the sequencer 90 reads the subsequent sequence data block 2 from the first sequence cache memory and executes the same.

Next, the sequencer 90 detects a read-ahead instruction in the subsequent second data block 2 and stores the designated scan sequence data block 2 in the second sequence cache memory 94. In this case, the read-ahead means 72 may delete the scan sequence data block 1 from the second sequence cache memory.

Generating one test pattern, the data development section 170 may execute the scan sequence data block 1 multiple times as shown in FIG. 6. The pattern generator 50 according to the present embodiment reads the scan sequence data block designated by the read-ahead instruction from the main memory 60 and stores the same in the second sequence cache memory 94. Therefore, the data block stored in one area in the main memory 60 can be executed multiple times. Thereby the capacity of the main memory 60 can be reduced in comparison with storing the data blocks in the main memory 60 in the execution order.

Additionally, the pattern generator 50 according to the present embodiment stores the data blocks for the scan test, which are designated by the read-ahead instruction in the cache memory, so that the function test and the scan test can be selectively combined.

In the present embodiment, the operation for the sequence data blocks is described, however, the pattern generator 50 executes the same operation for the pattern data blocks corresponding to the sequence data blocks.

Figure 7:
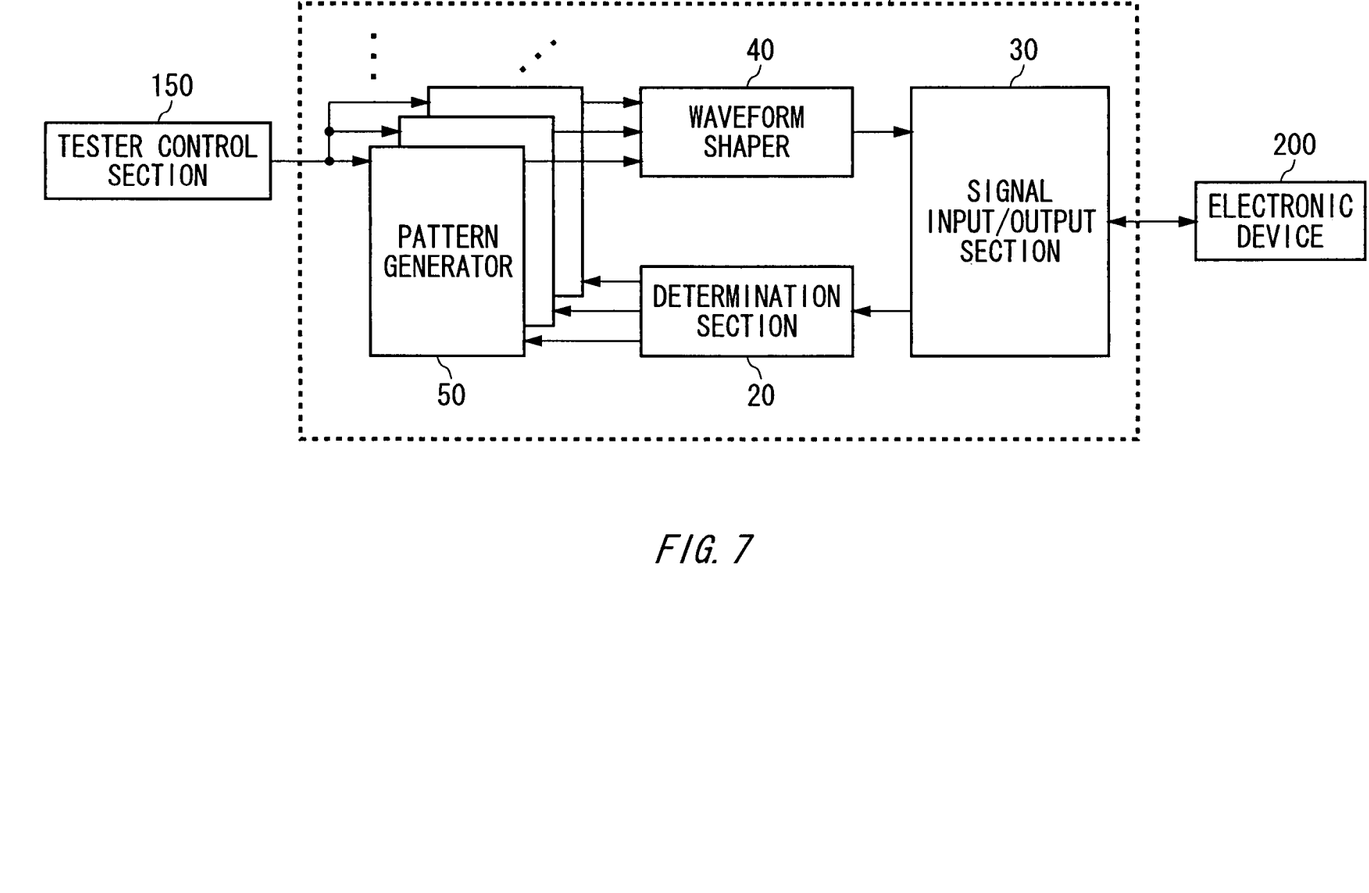
FIG. 7 shows another example of the configuration of the test apparatus 100.

FIG. 7 shows another example of the configuration of the test apparatus 100. The test apparatus 100 includes a plurality of pattern generators 50 corresponding to a plurality of pins of the electronic device 200. The test apparatus 100 may includes a plurality of waveform shapers 40 corresponding to each of the pattern generators 50.

The tester control section 150 controls individually each of the pattern generators 50. The signal input/output section 30 provides test patterns generated by each of the pattern generators 50 to the corresponding pins of the electronic device 200.

The electronic device 200 has a pin for scan tests. When a scan test is executed, the test apparatus 100 may provide the test pattern for the scan test to the pin for scan tests, and reserve the signal provided just before for the other pins. That is to say, the pattern generators 50 corresponding to the other pins may not generate any test pattern but reserve the outputs.

Figure 8:
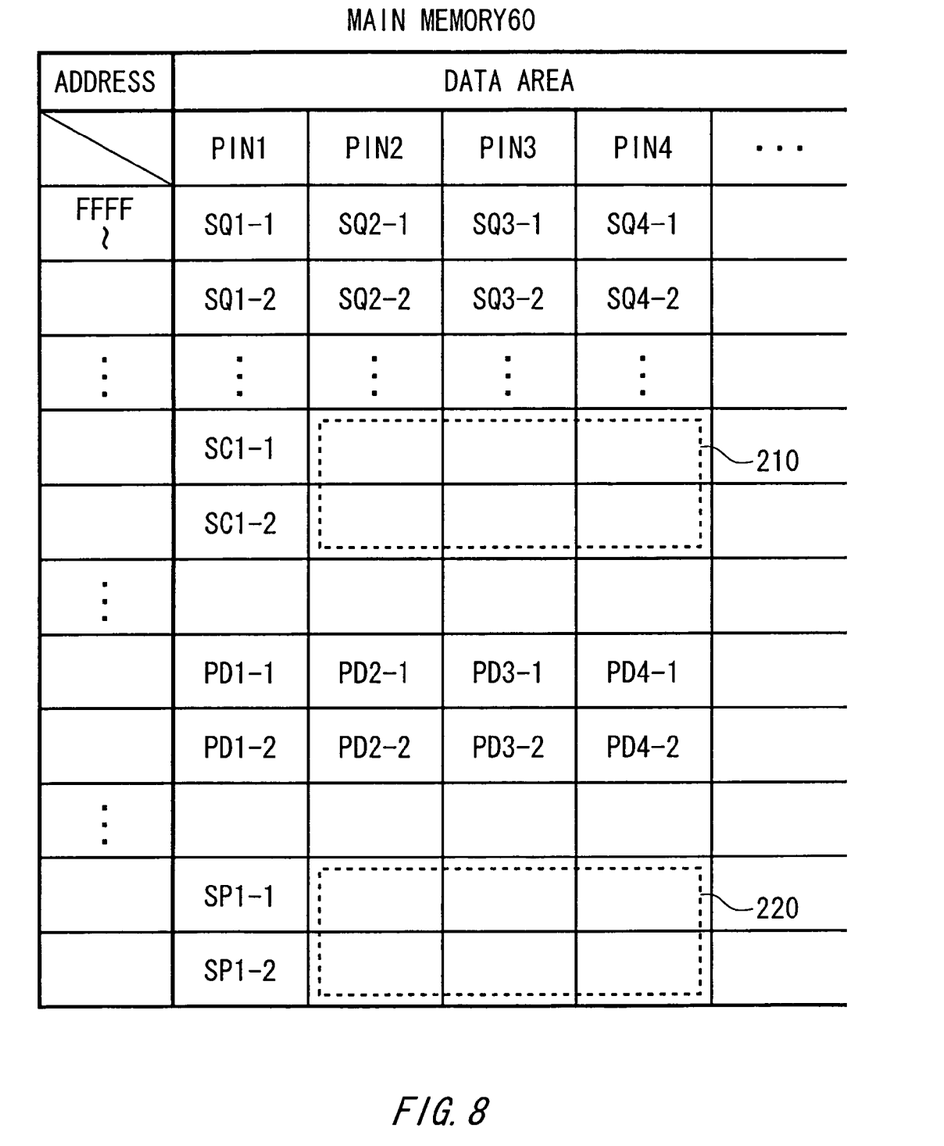
FIG. 8 shows an example of the data configuration of a plurality of main memories 60.
Figure 9:
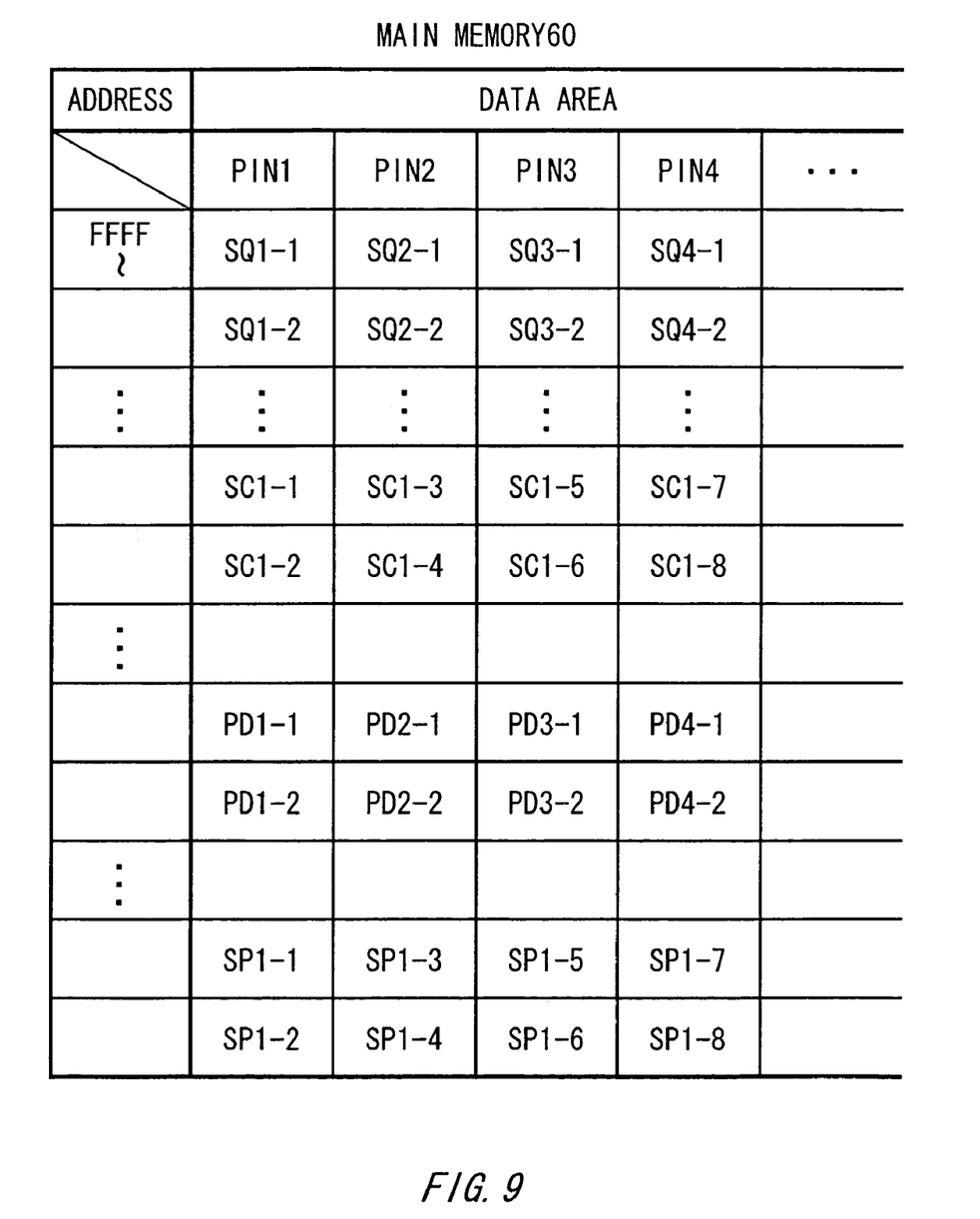
FIG. 9 shows an example of the data configuration of a plurality of main memories 60.

FIG. 8 and FIG. 9 show each example of the data configuration of a plurality of main memories 60. The data area of each of the main memories 60 is shown by the corresponding pin name in FIG. 8 and FIG. 9. The main memory 60 stores a plurality of sequence data blocks (SQ), a plurality of scan sequence data blocks (SC), a plurality of pattern data blocks (PD) and a plurality of scan pattern data blocks (SP) as well as the main memory 60 described with reference to FIG. 4.

When the test apparatus 100 executes a scan test, the pattern generators 50 which are not corresponding to the pin for the scan test do not generate any test pattern. Therefore, the corresponding main memories 60 do not store the scan pattern data blocks and the scan sequence data blocks for the pins which are not used for the scan test. Accordingly, free areas are generated in the address space of the main memory 60.

For example, pin 1 is the pin for a scan test and pins 2-4 are the pins not used for the scan test. Since the main memory 60 does not store the scan sequence blocks and the scan pattern data blocks corresponding to the pins 2-4, free area 210 and 220 are generated in the address space.

The main memory 60 according to the present embodiment may store the data blocks executed in the other pattern generators 50. For example, the main memory 60 may store the scan sequence data block (SC1-n) for the pin 1 and the scan pattern data block (SP1-n) as shown in FIG. 9. In this case, a pattern generator 50 has means for reading data blocks from the main memories 60 of the other pattern generators 50. For example, the memory control section 70 may read data blocks from the main memories 60 of the other pattern generators 50. The test apparatus 100 according to the present embodiment can efficiently use the area of the main memory 60, so that the capacity of the main memory 60 can be reduced.

As thus described above, the test apparatus 100 according to the present embodiment can efficiently generate test patterns and reduce the memory capacity.

While the present invention have been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

According to the present invention as thus described above, test pattern can be efficiently generated, an electronic device can be efficiently tested and the memory capacity used can be reduced.

What is claimed is:

1. A pattern generator for generating a test pattern for testing an electronic device from a predetermined test data, comprising:

a main memory for storing a plurality of sequence data blocks for generating the test pattern;

a first sequence cache memory and a second sequence cache memory for sequentially storing the sequence data blocks;

a data development section for sequentially executing the sequence data blocks stored in the first sequence cache memory and generating the test pattern; and a read-ahead means, when the data development section detects a read-ahead instruction on reading ahead the other sequence blocks during executing one sequence data block, for reading the other sequence data blocks from the main memory and storing the same in the second sequence cache memory, wherein the data development section reads the other sequence data blocks from the second sequence cache memory and executes the same when the data development section detects a jump instruction on executing the other sequence data blocks after detecting the read-ahead instruction, alternatively, reads the subsequent sequence data block from the first sequence cache memory and executes the same when the data development section does not detect the jump instruction in the one sequence data block after detecting the read-ahead instruction.

2. The pattern generator according to claim 1, wherein the main memory further stores a plurality of pattern data blocks indicative of signals to be provided to the electronic device corresponding to the sequence data blocks, the pattern generator further comprises a first pattern cache memory for storing the pattern data blocks corresponding to the sequence data blocks stored in the first sequence cache memory and a second pattern cache memory, the read-ahead means reads the pattern data blocks corresponding to the other sequence data blocks from the main memory and stores the same in the second pattern cache memory when the data development section detects a read-ahead instruction on reading ahead the other sequence data blocks during executing the one sequence data block, and the data development section develops the pattern data blocks corresponding to the other sequence data blocks by executing the sequence data blocks to generate the test pattern.

3. The pattern generator according to claim 2, wherein the read ahead instruction designates the first addresses of the sequence data block and the corresponding pattern data block in the main memory, and the read-ahead means reads ahead the sequence data block and the pattern data block from main memory using the designated first addresses.

4. The pattern generator according to claim 2, wherein the read-ahead instruction designates the labels of the sequence data block and the pattern data block to be read ahead, the pattern generator further comprises a reference memory for associating the labels with the addresses of the sequence data block and the pattern data block, which are designated by the labels in the main memory and stores the same, and the read-ahead means obtains the addresses of the main memory from the reference memory based on the labels and reads ahead the sequence data block and the pattern data block from the main memory based on the obtained addresses.

5. The pattern generator according to claim 2, wherein the sequence data block includes a scan sequence data block for executing a scan test for the electronic device and the pattern data block includes a scan pattern data block for executing the scan test for the electronic device, and the read-ahead means reads ahead the scan sequence data block and the scan pattern data block.

6. The pattern generator according to claim 2, wherein the data development section executes one of the scan sequence block multiple times in generating one of the test pattern.

7. The pattern generator according to claim 6, wherein the main memory stores a plurality of scan sequence data blocks in continuous areas.

8. The pattern generator according to claim 6, wherein the main memory stores a plurality of scan pattern data blocks in continuous areas.

9. The pattern generator according to claim 1, wherein the data development section reads an instruction following a return instruction in the one sequence data block from the first sequence cache memory when the data development section detects the return instruction on returning to the instruction following the jump instruction in one of the sequence data blocks during executing the other sequence data blocks.

10. A test apparatus for testing an electronic device, comprising:

a pattern generator for generating a test pattern for testing the electronic device;

an waveform shaper for shaping the test pattern; and a determination section for determining whether is good or bad of the electronic device based on the output signal outputted by the electronic device according to the test pattern, wherein the pattern generator including:

a main memory for storing a plurality of sequence data blocks for generating the test pattern;

a first sequence cache memory for sequentially storing the sequence data blocks;

a second sequence cache memory;

a data development section for sequentially executing the sequence data blocks stored in the first cache memory and generating the test pattern; and a read-ahead means, when the data development section detects a read-ahead instruction on reading ahead the other sequence data blocks during executing one of the sequence data blocks, for reading the other sequence data blocks from the main memory and stores the same in the second sequence cache memory, wherein the data development section reads the other sequence data blocks from the second sequence cache memory and executes the same when the data development section detects a jump instruction on executing the other sequence data blocks after detecting the read-ahead instruction, alternatively, reads the subsequent sequence data block from the first sequence cache memory and executes the same when the data development section does not detect the jump instruction in the one sequence data block after detecting the read-ahead instruction.

* * * * *